US012665378B2

(12) United States Patent (10) Patent No.: US 12,665,378 B2
Nagao et al. (45) Date of Patent: Jun. 23, 2026

(54) OPTICAL SEMICONDUCTOR DEVICE

(71) Applicant: Mitsubishi Electric Corporation, Tokyo (JP)

(72) Inventors: Ryosuke Nagao, Tokyo (JP); Keita Mochizuki, Tokyo (JP); Takashi Nagira, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 686 days.

(21) Appl. No.: 18/043,018

(22) PCT Filed: Nov. 24, 2020

(86) PCT No.: PCT/JP2020/043646
§ 371 (c)(1),
(2) Date: Feb. 24, 2023

(87) PCT Pub. No.: WO2022/113165
PCT Pub. Date: Jun. 2, 2022

(65) Prior Publication Data
US 2023/0361524 A1 Nov. 9, 2023

(51) Int. Cl.
*H01S 3/10* (2006.01)
*H01S 5/06* (2006.01)
(Continued)

(52) U.S. Cl.
CPC ........ *H01S 3/10053* (2013.01); *H01S 5/0612* (2013.01); *H01S 5/141* (2013.01); *H01S 5/50* (2013.01)

(58) Field of Classification Search
CPC .................................................. H01S 5/4068
See application file for complete search history.

(56) References Cited

U.S. PATENT DOCUMENTS 9,042,008 B2 * 5/2015 Saito ...................... H01S 3/067
359/344
10,333,280 B2 * 6/2019 Ishii ......................... G02B 6/42
(Continued)

FOREIGN PATENT DOCUMENTS

JP H01-293683 A 11/1989
JP 2009-529782 A 8/2009
(Continued)

OTHER PUBLICATIONS

International Search Report issued in PCT/JP2020/043646; mailed Jan. 19, 2021.
(Continued)

*Primary Examiner* — Deandra M Hughes
(74) *Attorney, Agent, or Firm* — Studebaker Brackett PLLC

(57) ABSTRACT
An optical semiconductor device according to the present disclosure includes a semiconductor substrate, at least one semiconductor laser provided on the semiconductor substrate, an optical multiplexer/demultiplexer circuit provided on the semiconductor substrate, multiplexing or demultiplexing first output light of the semiconductor laser and outputting second output light and third output light, a first waveguide portion provided on the semiconductor substrate, and outputting the second output light from an end face of the semiconductor substrate, and a second waveguide portion including an optical amplifier amplifying the third output light and a reflecting portion and provided on the semiconductor substrate, wherein the reflecting portion includes a diffraction grating that reflects the third output light amplified by the optical amplifier to feed back to the semiconductor laser via the optical amplifier and the optical multiplexer/demultiplexer circuit, and the semiconductor laser and the reflecting portion form a resonator.

14 Claims, 10 Drawing Sheets

(51) Int. Cl.
 *H01S 5/14* (2006.01)
 *H01S 5/50* (2006.01)

(56) References Cited

U.S. PATENT DOCUMENTS

| | | | | |
|---|---|---|---|---|
| 10,439,357 B2 * | 10/2019 | Cheung | | H01S 5/1032 |
| 10,530,124 B2 * | 1/2020 | Cheung | | H01S 5/1032 |
| 12,092,909 B2 * | 9/2024 | Larson | | G02F 1/2252 |
| 2010/0020840 A1 * | 1/2010 | Hayakawa | | H01S 5/12 |
| | | | | 372/50.11 |
| 2010/0142567 A1 * | 6/2010 | Ward | | H01S 5/141 |
| | | | | 372/20 |
| 2010/0232458 A1 | 9/2010 | Kim et al. | | |
| 2013/0243362 A1 * | 9/2013 | Van Orden | | G02F 1/0147 |
| | | | | 385/47 |
| 2016/0079735 A1 * | 3/2016 | Shahine | | H01S 5/4068 |
| | | | | 359/345 |
| 2016/0276803 A1 | 9/2016 | Uesaka | | |
| 2018/0226767 A1 * | 8/2018 | Takabayashi | | G01J 1/4257 |
| 2018/0331500 A1 * | 11/2018 | Cheung | | H01S 5/4068 |
| 2018/0366901 A1 * | 12/2018 | Shim | | H01S 5/02453 |
| 2019/0013640 A1 * | 1/2019 | Cheung | | H01S 5/4062 |
| 2019/0391459 A1 * | 12/2019 | Shin | | H01S 5/4075 |

| | | | | |
|---|---|---|---|---|
| 2020/0103679 A1 * | 4/2020 | Lee | | H01S 5/4062 |
| 2021/0126421 A1 * | 4/2021 | Tanaka | | H01S 5/4068 |
| 2021/0175689 A1 * | 6/2021 | Eggleston | | H01S 5/4062 |
| 2022/0116117 A1 * | 4/2022 | Nagao | | H04B 10/503 |

FOREIGN PATENT DOCUMENTS

| | | | | | |
|---|---|---|---|---|---|
| JP | 4444368 | B1 * | 3/2010 | | G02B 6/12004 |
| JP | 6245656 | B2 * | 12/2017 | | H01S 5/026 |
| JP | 6638497 | B2 | 1/2020 | | |
| WO | WO-2020240645 | A1 * | 12/2020 | | H04B 10/506 |

OTHER PUBLICATIONS

An Office Action mailed by The State Intellectual Property Office of People's Republic of China on Sep. 21, 2024, which corresponds to Chinese Patent Application No. 202080106047.X and is related to U.S. Appl. No. 18/043,018; with English translation.

An Office Action mailed by China National Intellectual Property Administration on Jan. 24, 2025, which corresponds to Chinese Patent Application No. 202080106047.X and is related to U.S. Appl. No. 18/043,018; with English language translation.

\* cited by examiner

FIG.1

OPTICAL SEMICONDUCTOR DEVICE

FIELD

The present disclosure relates to an optical semiconductor device.

BACKGROUND

PTL 1 discloses a semiconductor laser device. In the semiconductor laser device, an optical output waveguide portion and an optical feedback waveguide portion are formed on the same semiconductor substrate. The optical output waveguide portion includes a semiconductor laser portion that oscillates in a single mode, an optical branch circuit portion that makes oscillation light of the semiconductor laser portion branch into two paths, and a first semiconductor amplifier that amplifies light on one path branched by the optical branch circuit portion and outputs the amplified light. The optical feedback waveguide portion includes a second semiconductor amplifier that amplifies light on the other path branched by the optical branch circuit portion and a reflector that reflects the light amplified by the second semiconductor amplifier. The light amplified by the second semiconductor amplifier and reflected by the reflector is fed back to the semiconductor laser portion via the optical branch circuit portion. As a result of part of the oscillation light of the semiconductor laser being fed back, it is possible to achieve a narrower spectral line width. The reflector is a cleaved surface that is exposed on a side surface of a semiconductor chip.

CITATION LIST

Patent Literature

[PTL 1] JP 6245656 B

SUMMARY

Technical Problem

A phase of an oscillation mode of a resonator formed between a semiconductor laser and a cleaved surface requires to match a phase of an oscillation mode of the semiconductor laser itself. In PTL 1, a phase of the oscillation mode of the resonator depends on a position of the cleaved surface. Position accuracy of the cleaved surface is usually approximately ±20 μm. There is therefore a possibility that it is difficult to make the phases of the oscillation modes match each other by adjusting the position of the cleaved surface. Thus, in terms of improvement in a yield ratio, a phase adjustment region for adjusting the phase of the oscillation mode may be required. This may increase a size of the semiconductor laser device.

Further, in PTL 1, a curved waveguide is formed to guide light to the cleaved surface that is exposed on the side surface of the semiconductor chip. For example, in a case where a buried-heterostructure is used in the curved waveguide, typically, at least approximately several hundred micrometers are required as a curvature radius of the curved waveguide. This may increase a width of the semiconductor chip.

An object of the present disclosure is to obtain an optical semiconductor device with a smaller size.

Solution to Problem

An optical semiconductor device according to the present disclosure includes a semiconductor substrate, at least one semiconductor laser provided on the semiconductor substrate, an optical multiplexer/demultiplexer circuit provided on the semiconductor substrate, the optical multiplexer/demultiplexer circuit multiplexing or demultiplexing first output light of the semiconductor laser and outputting second output light and third output light, a first waveguide portion provided on the semiconductor substrate, the first waveguide portion outputting the second output light from an end face of the semiconductor substrate, and a second waveguide portion including an optical amplifier amplifying the third output light and a reflecting portion, the second waveguide portion being provided on the semiconductor substrate, wherein the reflecting portion includes a diffraction grating that reflects the third output light amplified by the optical amplifier to feed back to the semiconductor laser via the optical amplifier and the optical multiplexer/demultiplexer circuit, and the semiconductor laser and the reflecting portion form a resonator.

Advantageous Effects of Invention

In an optical semiconductor device according to the present disclosure, a semiconductor laser and a reflecting portion form a resonator. This eliminates the need of a phase adjustment region, so that it is possible to achieve a smaller optical semiconductor device.

BRIEF DESCRIPTION OF DRAWINGS

FIG. 1 is a plan view of an optical semiconductor device according to Embodiment 1.

DESCRIPTION OF EMBODIMENTS

Figure 2:
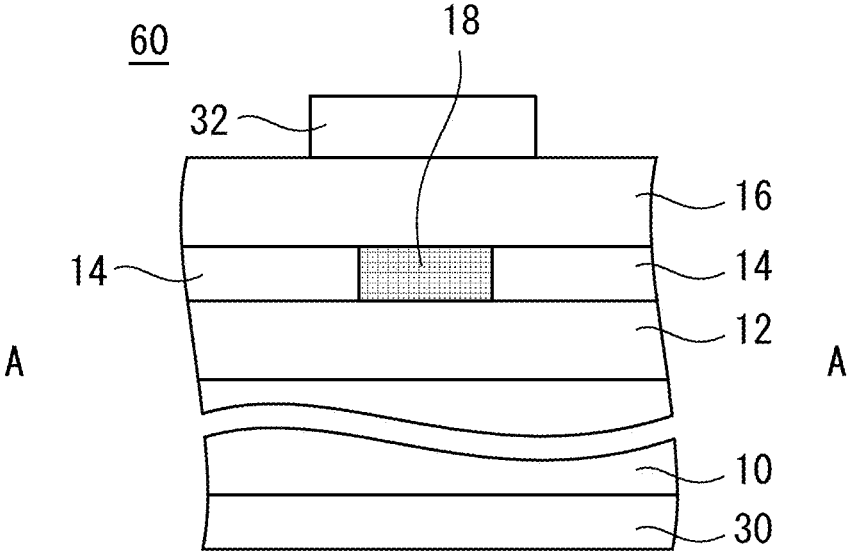
FIG. 2 is a cross-sectional view obtained by cutting FIG. 1 along a line A-A.

An optical semiconductor device according to each embodiment is described with reference to drawings. Identical or corresponding constitutional elements are given the same reference numerals, and the repeated description of such constitutional elements may be omitted.

Embodiment 1

Figure 1:
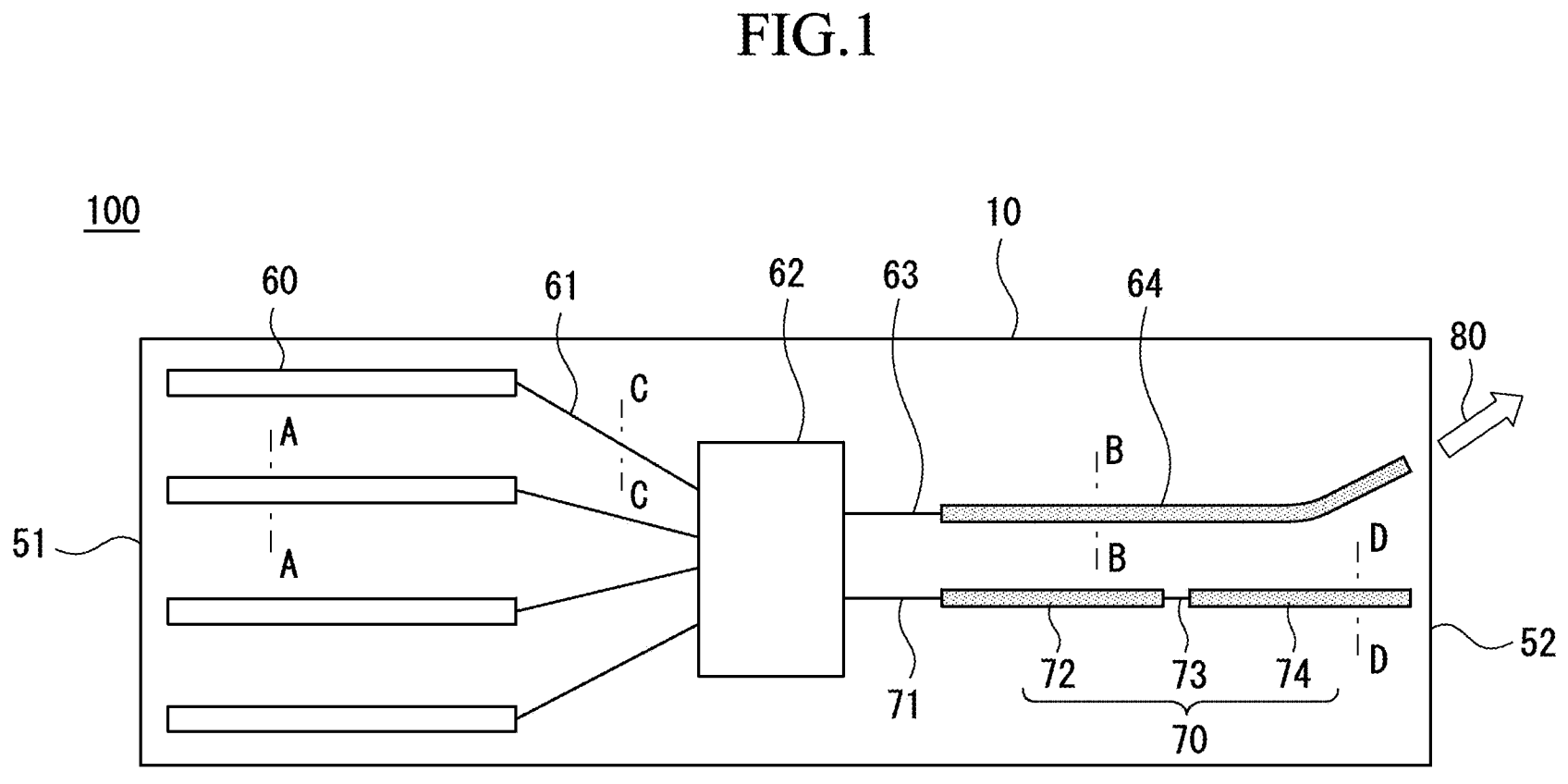

FIG. 1 is a plan view of an optical semiconductor device 100 according to Embodiment 1. In the optical semiconductor device 100, a plurality of semiconductor lasers 60, a plurality of waveguides 61, an optical multiplexer/demultiplexer circuit 62, a waveguide 63, an optical amplifier 64, a waveguide 71, an optical amplifier 72, a waveguide 73, and a reflecting portion 74 are provided on the same semiconductor substrate 10. The semiconductor substrate 10 includes a front end surface 52 and a rear end surface 51.

The plurality of semiconductor lasers 60 constitute a semiconductor laser array. While FIG. 1 illustrates an example where the optical semiconductor device 100 includes four semiconductor lasers 60, it is only necessary that a plurality of semiconductor lasers 60 are provided. For example, 16 semiconductor lasers 60 may be provided. The semiconductor laser 60 is, for example, a distributed feedback-laser diode (DFB-LD). The semiconductor laser 60 outputs first output light from a front end side. Further, the semiconductor laser 60 outputs rear end surface side output light from a rear end side. Each of the semiconductor lasers 60 can oscillate light in a single mode. Further, the plurality of semiconductor lasers 60 perform oscillation at different wavelengths. Note that an auxiliary semiconductor laser 60 may be mounted on the optical semiconductor device 100. In this case, the plurality of semiconductor lasers 60 may include semiconductor lasers that oscillate light of the same wavelength.

The plurality of waveguides 61 connect the plurality of semiconductor lasers 60 and the optical multiplexer/demultiplexer circuit 62. The plurality of waveguides 61 guide the first output light of the plurality of semiconductor lasers 60 to the optical multiplexer/demultiplexer circuit 62. The plurality of waveguides 61 constitute a waveguide array. The waveguides 61 of the same number as the number of the semiconductor lasers 60 are provided.

The optical multiplexer/demultiplexer circuit 62 multiplexes or demultiplexes the first output light of the semiconductor laser 60 and outputs second output light and third output light. The optical multiplexer/demultiplexer circuit 62 of the present embodiment has an input side to which the plurality of waveguides 61 are connected and an output side to which the waveguides 63 and 71 are connected. The optical multiplexer/demultiplexer circuit 62 multiplexes the first output lights of the semiconductor lasers 60 and outputs the multiplexed first output lights to the waveguides 63 and 71 respectively as the second output light and the third output light. The optical multiplexer/demultiplexer circuit 62 is multi input two output. In a case where 16 semiconductor lasers 60 are provided, the optical multiplexer/demultiplexer circuit 62 is, for example, 16×2-multi-mode interference (MMI). The optical multiplexer/demultiplexer circuit 62 does not have to be an MMI.

The waveguide 63 connects the optical multiplexer/demultiplexer circuit 62 and the optical amplifier 64. The optical amplifier 64 amplifies the second output light and outputs the amplified second output light to outside of the optical semiconductor device 100 as output light 80. The waveguide 63 and the optical amplifier 64 of the present embodiment constitute a first waveguide portion that outputs the second output light from a front end surface 52 of the semiconductor substrate 10. Note that it is only necessary that the first waveguide portion can output the second output light to outside, and the optical amplifier 64 does not have to be provided.

The optical amplifier 72 is connected to the waveguide 71. The optical amplifier 72 amplifies the third output light and outputs the amplified third output light to the waveguide 73. The reflecting portion 74 is connected to the waveguide 73. The optical amplifier 72, the waveguide 73 and the reflecting portion 74 constitute a second waveguide portion 70. The second waveguide portion 70 has a linear shape.

The reflecting portion 74 is a sampled grating-distributed feedback reflector (SG-DBR) having a plurality of reflection peaks. Oscillation wavelengths of the plurality of semiconductor lasers 60 match the plurality of reflection peaks of the SG-DBR. The reflecting portion 74 includes a plurality of diffraction gratings as will be described later. The reflecting portion 74 reflects the third output light amplified at the optical amplifier 72 by the plurality of diffraction gratings and feeds back the reflected amplified third output light to the plurality of semiconductor lasers 60 via the optical amplifier 72 and the optical multiplexer/demultiplexer circuit 62. Further, each semiconductor laser 60 and the reflecting portion 74 form a resonator.

In the optical semiconductor device 100 of the present embodiment, the output light 80 to be output from the optical amplifier 64 is used in optical communication. In an example illustrated in FIG. 1, a portion of the optical amplifier 64 on an upstream side in a light traveling direction extends in a longitudinal direction of the optical semiconductor device 100. Further, a portion of the optical amplifier 64 on a downstream side in the light traveling direction is inclined with respect to the longitudinal direction of the optical semiconductor device 100. Thus, the output light 80 is output obliquely with respect to a vertical line of the front end surface 52. A rear end surface 51 and the front end surface 52 of the optical semiconductor device 100 are formed through cleavage. On the rear end surface 51 and the front end surface 52, for example, anti reflection (AR) coating is applied.

A longitudinal structure of the optical semiconductor device 100 will be described next. The optical amplifiers 64 and 72 have the same longitudinal structure. Further, the waveguides 61, 63, 71 and 73 have the same longitudinal structure.

FIG. 2 is a cross-sectional view obtained by cutting FIG. 1 along a line A-A. The semiconductor laser 60 includes the semiconductor substrate 10 formed with InP. A first clad layer 12 formed with InP is provided on an upper surface of the semiconductor substrate 10. An active layer 18 and a current block layer 14 formed with InP are provided on an upper surface of the first clad layer 12. The current block layer 14 is provided on both sides of the active layer 18. The active layer 18 is formed with InGaAsP, InGaAlAs or composition of InGaAsP and InGaAlAs. A second clad layer 16 formed with InP is provided on an upper surface of the active layer 18 and the current block layer 14. The first clad layer 12, the active layer 18, the current block layer 14 and the second clad layer 16 constitute an epi-structure portion. An anode electrode 32 is provided on an upper surface of the epi-structure portion. A cathode electrode 30 is provided on a rear surface of the semiconductor substrate 10.

Figure 3:
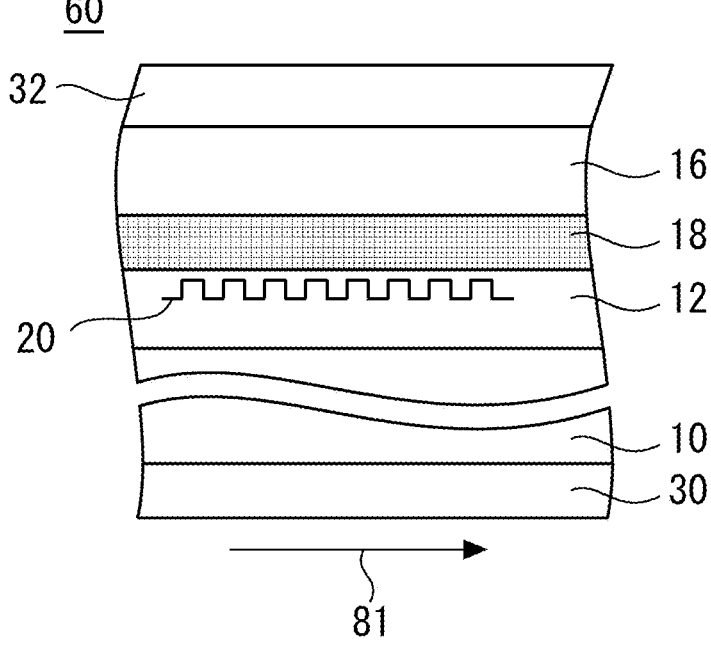
FIG. 3 is a cross-sectional view of the semiconductor laser according to Embodiment 1 in a direction along an optical axis.

FIG. 3 is a cross-sectional view of the semiconductor laser 60 according to Embodiment 1 in a direction along an optical axis 81. The direction along the optical axis 81 is a direction from the rear end surface 51 toward the front end surface 52 and is a direction along the second waveguide portion 70. A diffraction grating 20 is provided on an upper surface or a rear surface of the active layer 18. While the diffraction grating 20 is provided on the first clad layer 12 in FIG. 3, the diffraction grating 20 may be provided on the second clad layer 16. Further, while a contact layer is provided on an upper surface of the second clad layer 16, that is, on a surface of the epi-structure portion, illustration is omitted in FIGS. 2 and 3.

If a forward bias is applied to the semiconductor laser 60, a current is injected from the anode electrode 32, thereby again occurs in the active layer 18. This generates sponta-neous emission light. The spontaneous emission light having a specific wavelength becomes seed light of induced emis-sion by the diffraction grating 20. If the injected current exceeds a threshold current determined in advance, the semiconductor laser 60 performs laser oscillation.

The cathode electrode 30 is an electrode common among the semiconductor laser 60 and the optical amplifiers 64 and 72. The cathode electrode 30 is, for example, formed on an entire rear surface of the semiconductor substrate 10.

Figure 4:
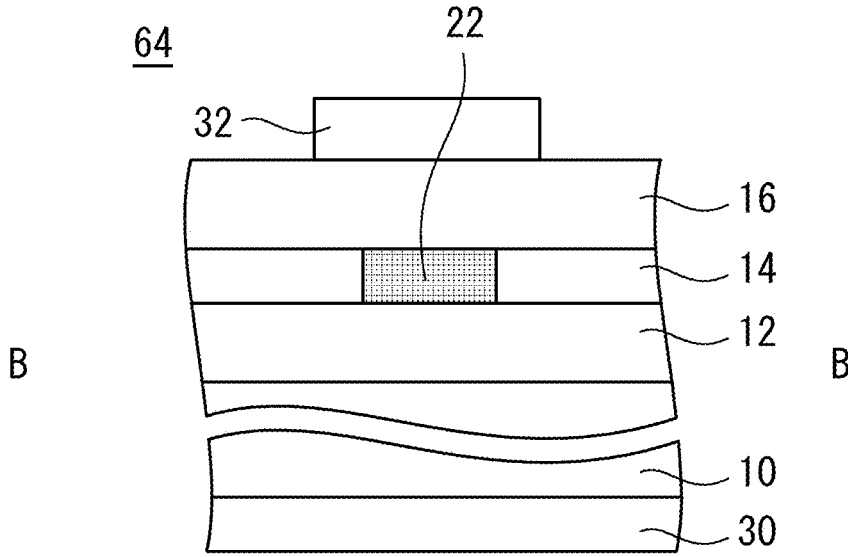
FIG. 4 is a cross-sectional view obtained by cutting FIG. 1 along a line B-B.

FIG. 4 is a cross-sectional view obtained by cutting FIG. 1 along a line B-B. The optical amplifier 64 includes the semiconductor substrate 10, and an epi-structure portion provided on the upper surface of the semiconductor sub-strate 10. The epi-structure portion of the optical amplifier 64 is different from the epi-structure portion of the semi-conductor laser 60 in that the active layer 18 is replaced by an active layer 22. The anode electrode 32 is provided on an upper surface of the epi-structure portion. Further, a contact layer is omitted. The active layer 22 is formed with InGaAsP or InGaAlAs that has a gain with respect to light guided through the waveguide 63 or composition of InGaAsP and InGaAlAs. Also in the optical amplifier 72 having a longi-tudinal structure similar to the longitudinal structure of the optical amplifier 64, the active layer 22 is formed to have a gain with respect to light guided through the waveguide 71.

If a forward bias is applied, the optical amplifier 64 amplifies the output light output from the semiconductor laser 60. The optical amplifier 64 is designed not to perform laser oscillation independently. Further, if a forward bias is not applied to the optical amplifier 64, the active layer 22 operates as a light absorption layer. Thus, the optical ampli-fier 64 can be utilized as a shutter upon switching of the wavelength.

Figure 5:
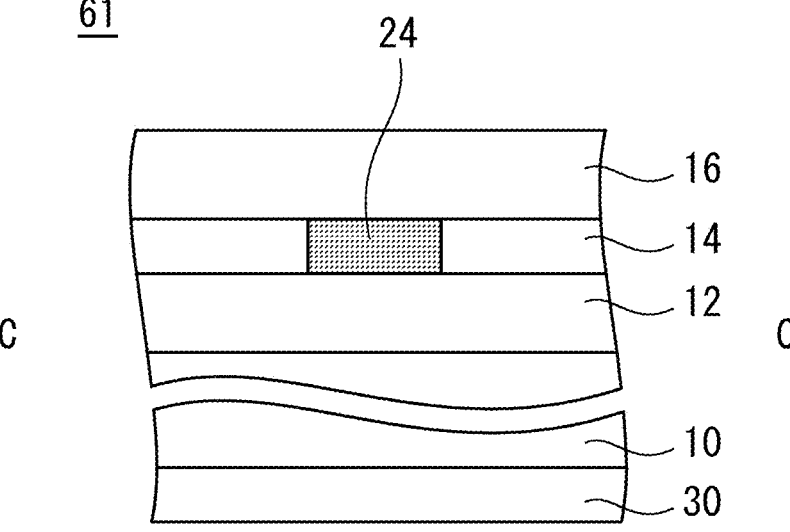
FIG. 5 is a cross-sectional view obtained by cutting FIG. 1 along a line C-C.

FIG. 5 is a cross-sectional view obtained by cutting FIG. 1 along a line C-C. The waveguide 61 includes the semi-conductor substrate 10, and an epi-structure portion pro-vided on the upper surface of the semiconductor substrate 10. The epi-structure portion of the waveguide 61 is different from the epi-structure portion of the semiconductor laser 60 in that the active layer 18 is replaced by a light confinement layer 24. The light confinement layer 24 is formed with InGaAsP. Further, the cathode electrode 30 is formed on the rear surface of the semiconductor substrate 10. The cathode electrode 30 is not necessary in terms of functions of the waveguide 61.

Figure 6:
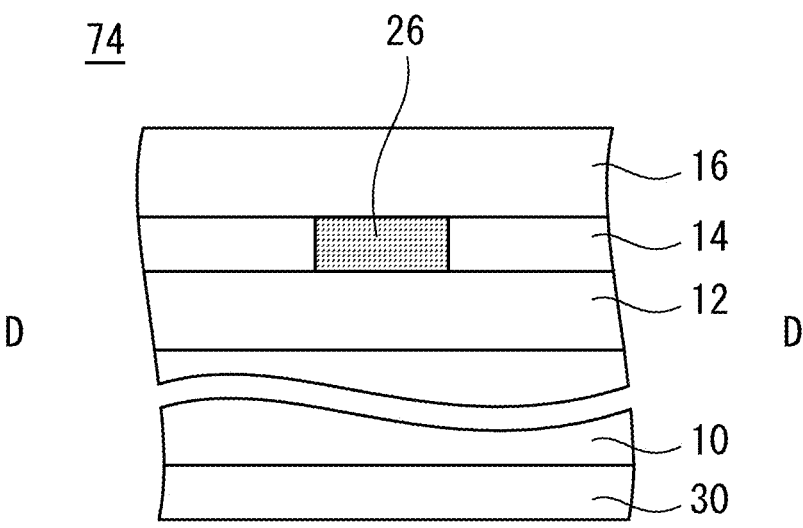
FIG. 6 is a cross-sectional view obtained by cutting FIG. 1 along a line D-D.

FIG. 6 is a cross-sectional view obtained by cutting FIG. 1 along a line D-D. In the reflecting portion 74, the first clad layer 12 is provided on the upper surface of the semicon-ductor substrate 10. The light confinement layer 26 and the current block layer 14 are provided on the upper surface of the first clad layer 12. The light confinement layer 26 is formed with InGaAsP. The current block layer 14 is pro-vided on both sides of the light confinement layer 26. The second clad layer 16 is provided on the upper surface of the light confinement layer 26 and the upper surface of the current block layer 14. The first clad layer 12, the light confinement layer 26, the current block layer 14, and the second clad layer 16 constitute an epi-structure portion. Note that while the cathode electrode 30 is not necessary in terms of functions of the reflecting portion 74, the cathode electrode 30 is formed on the rear surface of the semicon-ductor substrate 10 below the light confinement layer 26.

Figure 7:
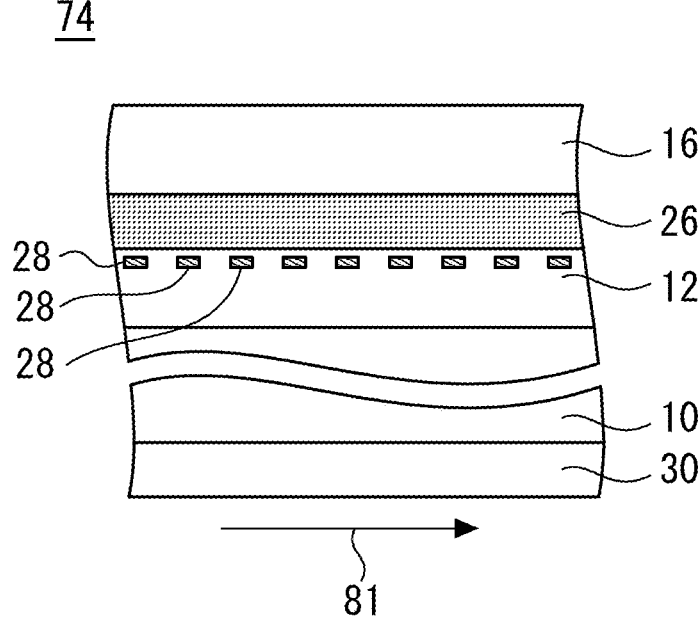
FIG. 7 is a cross-sectional view of the reflecting portion according to Embodiment 1 in a direction along the optical axis.

FIG. 7 is a cross-sectional view of the reflecting portion 74 according to Embodiment 1 in a direction along the optical axis 81. The reflecting portion 74 includes a plurality of diffraction gratings 28 discretely arranged along the optical axis 81 in the first clad layer 12. Each of the diffraction gratings 28 has a periodic structure of a refractive index. In other words, the diffraction gratings 28 are formed by layers having refractive indexes different from a refrac-tive index of the first clad layer 12 are periodically formed in the first clad layer 12. A plurality of reflection peaks are achieved by the plurality of diffraction gratings 28. The plurality of diffraction gratings 28 may be provided in the second clad layer 16.

Each of the active layers 18 and 22 and the light confine-ment layers 24 and 26 is an epitaxial layer formed using a metal organic chemical vapor deposition (MOCVD) appa-ratus, a molecular beam epitaxy (MBE) apparatus, or the like. The active layers 18 and 22 and the light confinement layers 24 and 26 are individually formed on the upper surface of the first clad layer 12 using a photolithography technique and an etching technique. In a case where the active layers 18 and 22 and the light confinement layers 24 and 26 are formed with the same material, the active layers 18 and 22 and the light confinement layers 24 and 26 can be formed at the same time through etching after the epitaxial layer is formed on the upper surface of the first clad layer 12.

As a core technology for achieving higher speed and higher capacity of a light transmission scheme, there is a digital coherent scheme utilizing phase information of light in modulation. In the digital coherent scheme, phase infor-mation of light is used, and thus, phase noise of a light source becomes a problem. As an index of the phase noise of the light source, a spectral line width is used. It is therefore particularly important to achieve a narrower spec-tral line width.

Typically, a narrower line width can be achieved by feeding back part of oscillation light of the semiconductor laser from outside. In the present embodiment, by returning part of the output light of the semiconductor laser 60 to the semiconductor laser 60 using the reflecting portion 74, the spectral line width can be made smaller. By feeding back part of light, the spectral line width can be made smaller by approximately double digits.

The SG-DBR, which is the reflecting portion 74 of the present embodiment, has a waveguide type reflecting struc-ture that essentially exhibits a reflection spectrum accom-panied by a plurality of periodic reflection peaks. In the present embodiment, for example, a reflecting structure that can operate in an entire C band can be obtained by making an interval of oscillation wavelengths of the plurality of semiconductor lasers 60 match the period of the reflection peaks of the SG-DBR.

A spectral line width $\Delta v0$ of a DFB-LD can be expressed using expression (1).

[Math. 1]

$$\Delta v_0 = \frac{R_{sp}K_z}{4\pi S_{av}V_{act}}\left(1 + \alpha^2\right) \tag{1}$$

Here, $R_{sp}$ is a spontaneous emission rate, $K_z$ is a longitudinal Petermann coefficient, $S_{av}$ is average photon density, $V_{act}$ is a volume of the active layer, and $\alpha$ is a line width enhancement factor. In a semiconductor laser having a strong optical feedback condition, a line width decreasing rate can be expressed using expression (2).

[Math. 2]

$$\frac{\Delta v}{\Delta v_0} = \left(\frac{n_a L_a}{n_a L_a + f_{ext} n_p L_p}\right)^2 \tag{2}$$

Here, $\Delta v$ indicates a spectral line width of an external resonator, and $\Delta v_0$ indicates a spectral line width of LD. Further, $n_a$ is a transmittance/refractive index of LD, $L_a$ is an LD length, $f_{ext}$ is a ratio of feedback light with respect to output light of LD, $n_p$ is a transmittance/refractive index of a passive region in the external resonator, and $L_p$ is an external resonator length.

For example, when $L_a$=1200 μm, $L_p$=4000 μm, $\Delta v_0$=100 kHz, and $f_{ext}$=0.3, $\Delta v$ is reduced to approximately 25 kHz by expression (2).

However, there is an optimal value for a light feedback amount. If the feedback amount is too large, oscillation of the semiconductor laser becomes unstable, and there is a possibility that the spectral line width may increase. The optical amplifier 72 can adjust the feedback amount of light that is reflected at the reflecting portion 74 and fed back to the semiconductor laser 60 so that the spectral line width of the output light 80 becomes a minimum. The optical amplifier 72 amplifies the third output light so that the line width of the output light 80 becomes smaller than in a case where at least the third output light is not amplified.

In a structure in which the cleaved surface is used as the reflecting portion as in PTL 1, for example, the spectral line width becomes smaller from approximately 1 MHz to approximately 10 kHz by injecting a current of 35 mA to the amplifier that adjusts the feedback light amount. Here, typically, a reflection rate on the cleaved surface is approximately 30%. In contrast, in a case where the DBR structure is used as the reflecting portion 74 as in the present embodiment, typically, a reflection rate of equal to or higher than 90% can be achieved. Thus, compared to a structure in which the cleaved surface is used as the reflecting portion, it is possible to achieve an equivalent spectral line width while reducing a current to be injected to the optical amplifier 72.

Further, when light is fed back to the semiconductor laser 60, phase control is important. In the optical semiconductor device 100, there are two oscillation modes of an oscillation mode of the semiconductor laser 60 itself and an oscillation mode of the resonator formed by the semiconductor laser 60 and the reflecting portion 74. To decrease the spectral line width using light feedback, in the present embodiment, a phase of the oscillation mode of the semiconductor laser 60 is made to match a phase of the oscillation mode of the resonator formed by the semiconductor laser 60 and the reflecting portion 74. In the present embodiment, to make the phases of the two oscillation modes match each other, it is only necessary to adjust positions of the plurality of semiconductor lasers 60.

Further, in a case where the DFB-LD is used as the semiconductor laser 60, for example, an electron beam (EB) exposure apparatus is used to form the diffraction gratings 20. Drawing accuracy of the EB exposure apparatus is, for example, approximately 1 nm. According to this accuracy, it is possible to make the phases of the two oscillation modes match each other.

In the present embodiment, the cleaved surface does not have to be used as the reflecting portion for light feedback. Thus, a phase adjustment region becomes unnecessary, so that it is possible to achieve a smaller optical semiconductor device 100. Further, a curved waveguide does not have to be formed to guide light to the cleaved surface. In the present embodiment, it is only necessary to form the second waveguide portion 70 in a linear shape that extends in the longitudinal direction of the optical semiconductor device 100. It is therefore possible to prevent a width of the optical semiconductor device 100 from increasing compared to a structure in a case where light feedback is not performed. It is therefore possible to achieve a smaller optical semiconductor device 100.

Further, in a field of optical communication, speed and capacity of a light transmission scheme become increasingly higher. As a core technology thereof, a wavelength division multiplexing (WDM) scheme in which a plurality of optical signals with different wavelengths are transmitted with one optical fiber in a multiplexed manner is in widespread use. There is a case where an auxiliary light source is secured in preparation for unexpected stoppage of a signal light source to stably perform optical communication using the WDM scheme. However, if auxiliary light sources are secured for respective wavelengths of optical signals to be multiplexed, the number of auxiliary light sources increases. Particularly, in a configuration in which one semiconductor laser is mounted on one optical semiconductor device, there is a possibility that cost for maintaining light sources may increase.

To reduce cost, as in the present embodiment, a wavelength variable light source capable of outputting laser light of a plurality of wavelengths with one optical semiconductor device is effective. In the optical semiconductor device 100, as a result of the plurality of semiconductor lasers 60 including an auxiliary semiconductor laser, it is possible to perform stable optical communication while reducing cost. In a case where 16 semiconductor lasers 60 are mounted on the optical semiconductor device 100, two sets of semiconductor lasers capable of outputting laser light of eight types of wavelengths can be mounted. Further, in a case where 16 semiconductor lasers 60 are mounted on the optical semiconductor device 100, four sets of semiconductor lasers capable of outputting laser light of four types of wavelengths can be mounted.

A material of each layer of the optical semiconductor device 100 is not limited to the above. Further, the second waveguide portion 70 and the waveguide 71 may be curved. Also in this case, a phase adjustment region is unnecessary, so that it is possible to achieve a smaller optical semiconductor device 100.

These modifications can be applied, as appropriate, to optical semiconductor devices according to the following embodiments. Note that the optical semiconductor devices according to the following embodiments are similar to that of the first embodiment in many respects, and thus differences between the optical semiconductor devices according to the following embodiments and that of the first embodiment will be mainly described below.

Embodiment 2

Figure 8:
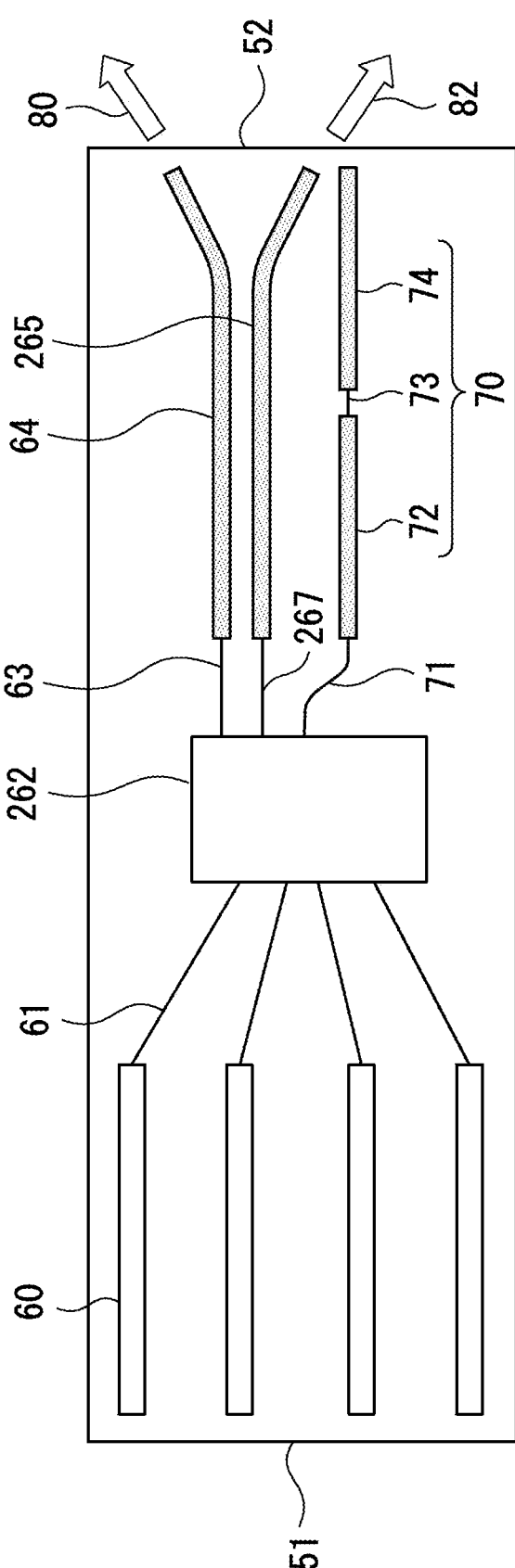
FIG. 8 is a plan view of an optical semiconductor device according to Embodiment 2.

FIG. 8 is a plan view of an optical semiconductor device 200 according to Embodiment 2. An optical multiplexer/ demultiplexer circuit 262 of the present embodiment is multi input multi output. A plurality of waveguides 63 and 267 are connected to an output side of the optical multiplexer/demultiplexer circuit 262. In a case where an MMI is used as the optical multiplexer/demultiplexer circuit 262, the number of output ports of the optical multiplexer/demultiplexer circuit 262 can be increased without increasing light loss of the second output light and the third output light in principle. The number of output ports can be increased to the number that is the same as the number of input ports.

For example, an optical amplifier 265 is connected to the waveguide 267. The fourth output light output from the optical multiplexer/demultiplexer circuit 262 is amplified by the optical amplifier 265 and emitted from the front end surface 52 as output light 82. The output light 82 can be utilized in, for example, wavelength monitoring. The output light 82 may be utilized as local oscillation light in an optical reception system in digital coherent communication.

A longitudinal structure of the waveguide 267 is similar to the longitudinal structure of the waveguide 61. Further, a longitudinal structure of the optical amplifier 265 is similar to the longitudinal structure of the optical amplifier 64.

In FIG. 8, a portion of the optical amplifier 265 on an upstream side in a light traveling direction extends in a longitudinal direction of the optical semiconductor device 200. Further, a portion of the optical amplifier 265 on a downstream side in the light traveling direction is inclined with respect to the longitudinal direction of the optical semiconductor device 200. Thus, the output light 82 is output obliquely with respect to a vertical line of the front end surface 52. In FIG. 8, the optical amplifier 265 is inclined on a side opposite to a side of the optical amplifier 64. The optical amplifier 265 does not have to be inclined. Further, the optical amplifier 265 does not have to be provided.

Embodiment 3

Figure 9:
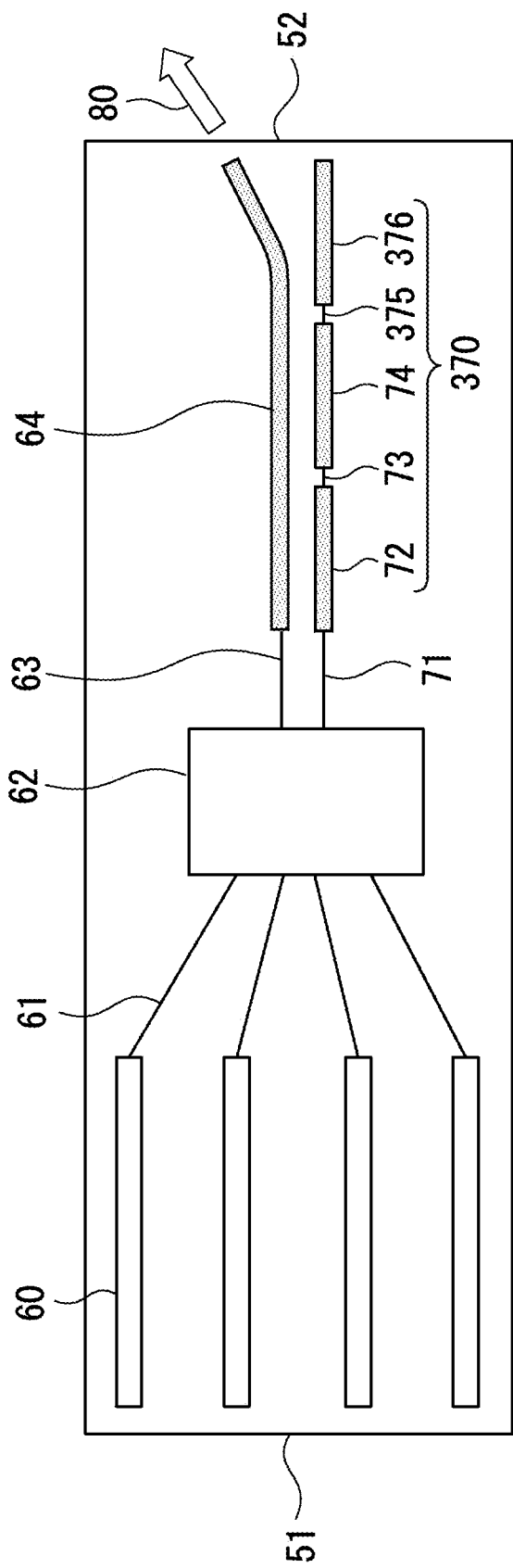
FIG. 9 is a plan view of an optical semiconductor device according to Embodiment 3.

FIG. 9 is a plan view of an optical semiconductor device 300 according to Embodiment 3. In the present embodiment, a configuration of a second waveguide portion 370 is different from the configuration of the second waveguide portion 70. In the second waveguide portion 370, a waveguide 375 is connected to the reflecting portion 74. A light absorption portion 376 is connected to the waveguide 375. In this manner, the second waveguide portion 370 includes the light absorption portion 376 that is provided on an opposite side of the optical amplifier 72 with respect to the reflecting portion 74 and absorbs light that has passed through the reflecting portion 74.

A longitudinal structure of the waveguide 275 is similar to the longitudinal structure of the waveguide 61. Further, a longitudinal structure of the light absorption portion 376 is similar to the longitudinal structure of the semiconductor laser 60. As illustrated in FIG. 2, the light absorption portion 376 includes the first clad layer 12 provided on the upper surface of the semiconductor substrate 10 and the active layer 18 provided on the upper surface of the first clad layer 12. Further, the current block layer 14 is provided on both sides of the active layer 18 on the upper surface of the first clad layer 12. The second clad layer 16 is provided on the upper surface of the active layer 18 and the upper surface of the current block layer 14. Further, the light absorption portion 376 does not include the anode electrode 32.

There is a case where part of light that is incident on the reflecting portion 74 is not reflected, passes through the reflecting portion 74 and becomes stray light. Typically, the spectral line width is affected by stray light, and the spectral line width increases or becomes more unstable as stray light increases. Thus, removing stray light becomes important to achieve a narrower line width. In the present embodiment, light that has passed through the reflecting portion 74 can be absorbed by the light absorption portion 376. It is therefore possible to reduce stray light and achieve a further smaller spectral line width.

Embodiment 4

Figure 10:
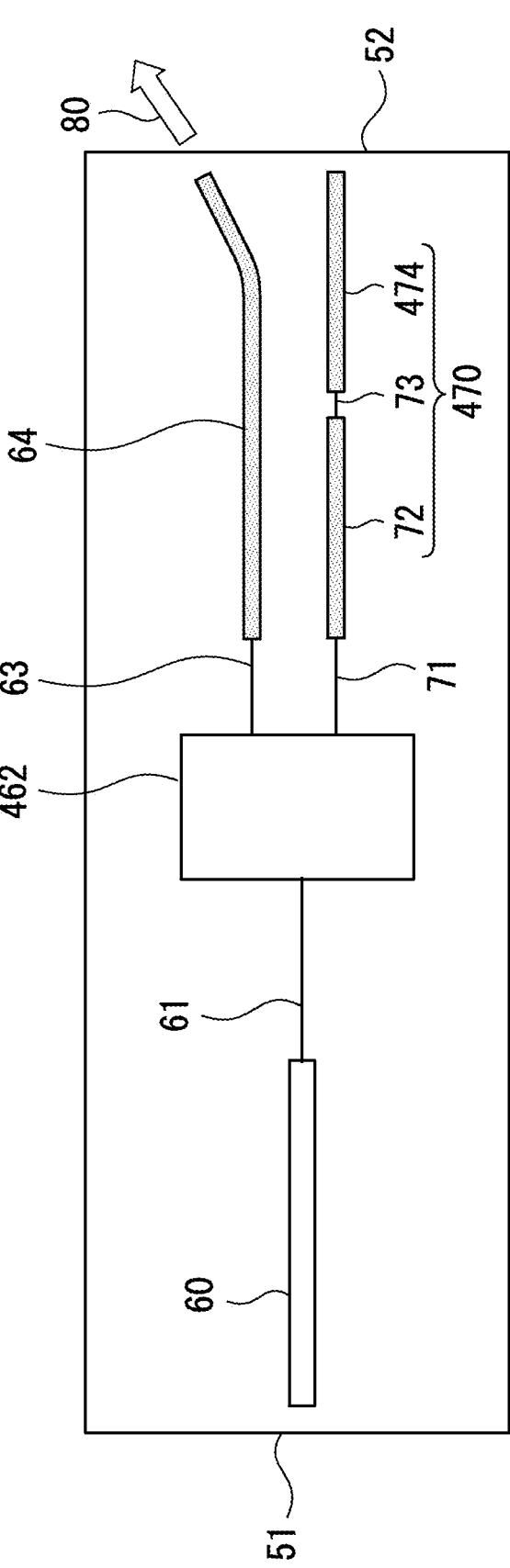
FIG. 10 is a plan view of an optical semiconductor device according to Embodiment 4.

FIG. 10 is a plan view of an optical semiconductor device 400 according to Embodiment 4. The present embodiment is different from Embodiment 1 in that an optical multiplexer/demultiplexer circuit 462 is one input two output. The optical semiconductor device 400 includes only one semiconductor laser 60. Further, a second waveguide portion 470 includes a reflecting portion 474. The reflecting portion 474 is a distributed feedback reflector (DBR) having one reflection peak. An oscillation wavelength of the semiconductor laser 60 matches the reflection peak of the DBR. The optical semiconductor device 400 is utilized as a single wavelength light source.

Figure 11:
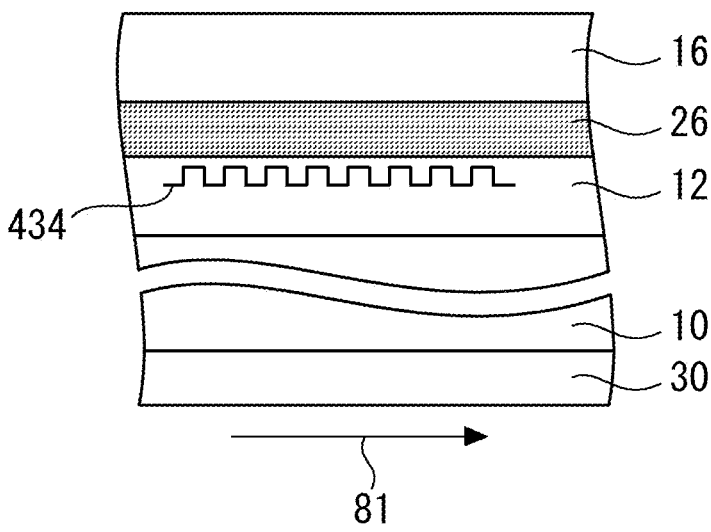
FIG. 11 is a cross-sectional view of the reflecting portion according to Embodiment 4 in a direction along the optical axis.

FIG. 11 is a cross-sectional view of the reflecting portion 474 according to Embodiment 4 in a direction along the optical axis 81. A longitudinal structure of the reflecting portion 474 is different from the longitudinal structure of the reflecting portion 74 in that a diffraction grating 434 is provided in place of the plurality of diffraction gratings 28 that are discretely positioned. The diffraction grating 434 may be provided in the second clad layer 16.

In the present embodiment, light feedback to the semiconductor laser 60 can be implemented by the DBR. It is therefore possible to obtain effects similar to the effects of Embodiment 1.

Embodiment 5

Figure 12:
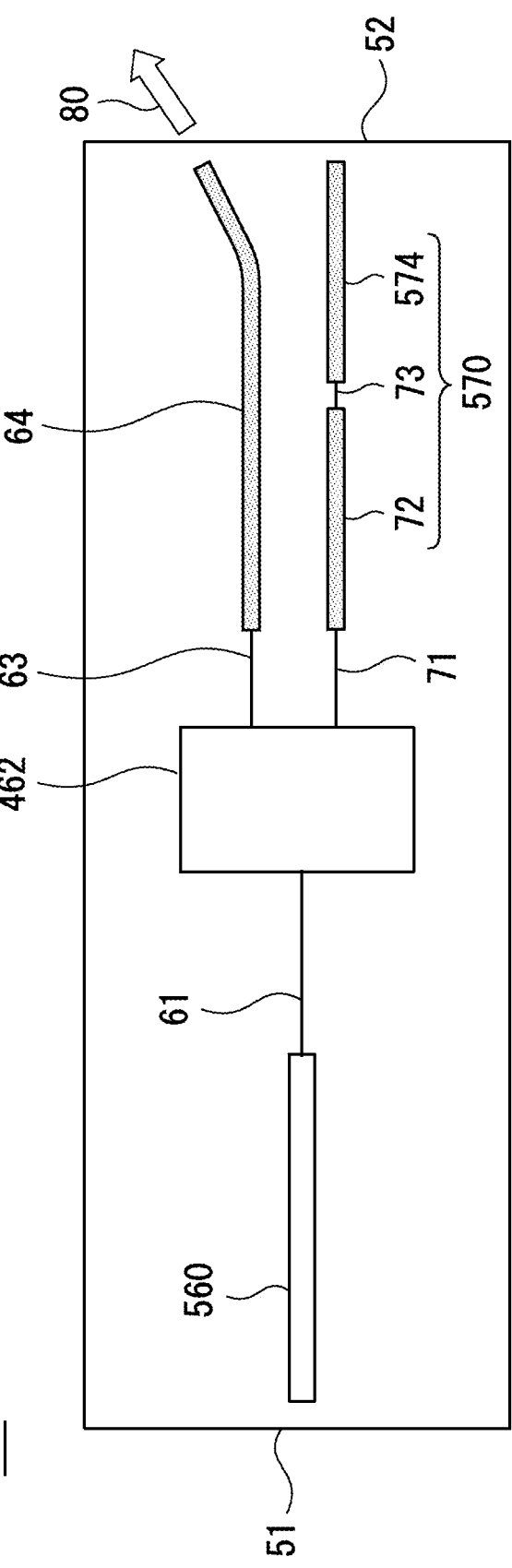
FIG. 12 is a plan view of an optical semiconductor device according to Embodiment 5.

FIG. 12 is a plan view of an optical semiconductor device 500 according to Embodiment 5. The optical semiconductor device 500 includes a single semiconductor laser 560. The semiconductor laser 560 is a sampled grating (SG)-DFB having a plurality of gain peaks. Further, the second waveguide portion 570 includes a reflecting portion 574. The reflecting portion 574 is a chirped sampled grating (CSG)-DBR having a plurality of reflection peaks. The CSG-DBR is different from the SG-DBR and has a reflection spectrum having a slightly different period of a plurality of reflection peaks.

Figure 13:
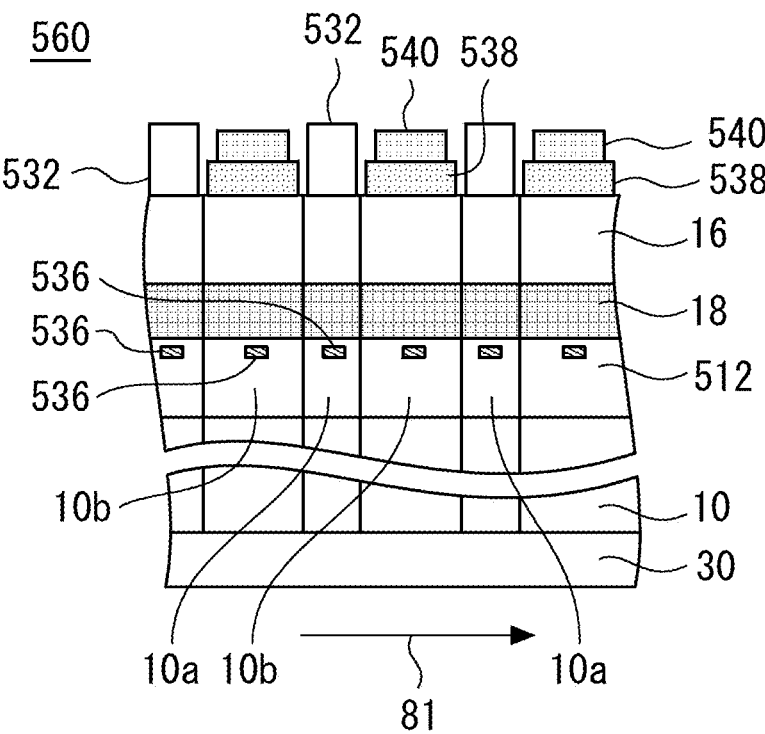
FIG. 13 is a cross-sectional view of the semiconductor laser according to Embodiment 5 in a direction along the optical axis.

FIG. 13 is a cross-sectional view of the semiconductor laser 560 according to Embodiment 5 in a direction along the optical axis 81. In a first clad layer 512 of the semiconductor laser 560, a plurality of diffraction gratings 536 are discretely formed along the optical axis 81. The plurality of diffraction gratings 536 may be provided in the second clad layer 16. The semiconductor laser 560 has a gain structure having a plurality of periodic gain peaks. Immediately above each of the diffraction gratings 536, an anode electrode 532 is provided or a heater 540 is provided via an insulating film 538. In the semiconductor laser 560, a region immediately below the anode electrode 532 is a gain region 10a, and a region immediately below the heater 540 is a phase shift region 10b.

In the gain region 10a, carriers are injected from the anode electrode 532, and photons are generated. A temperature of the phase shift region 10b can be changed by the heater 540. By this means, refractive indexes of the first clad layer 512 and the second clad layer 16 and an optical path length of the phase shift region 10*b* can be changed. It is therefore possible to change a resonator formed by the semiconductor laser 560 and the reflecting portion 574 and adjust an emission wavelength of the optical semiconductor device 500.

Figure 14:
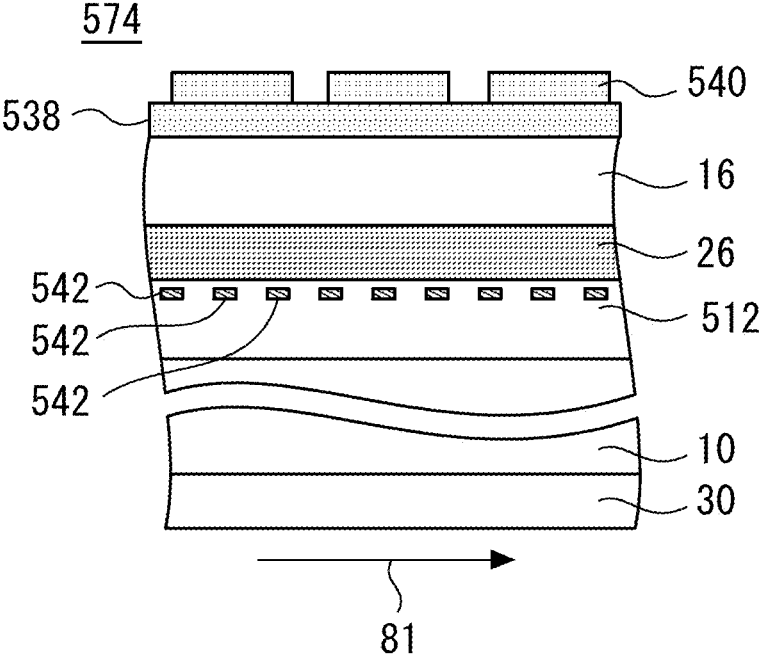
FIG. 14 is a cross-sectional view of the reflecting portion according to Embodiment 5 in a direction along the optical axis.

FIG. 14 is a cross-sectional view of the reflecting portion 574 according to Embodiment 5 in a direction along the optical axis 81. In the first clad layer 512 of the reflecting portion 574, a plurality of diffraction gratings 542 are discretely formed along the optical axis 81. The plurality of diffraction gratings 542 may be provided in the second clad layer 16. Further, the heater 540 is provided on the upper surface of the second clad layer 16 via the insulating film 538.

A period of reflection peaks of the reflecting portion 574 is different from a period of gain peaks of the semiconductor laser 560. In the reflecting portion 574, a plurality of reflection peaks can be adjusted by the heater 540. Specifically, the heater 540 can change optical characteristics such as a refractive index by changing a temperature of the waveguide immediately below the heater 540. It is therefore possible to shift the reflection spectrum. By this means, the semiconductor laser 560 outputs light of a wavelength that matches the plurality of reflection peaks of the reflecting portion 574 among the plurality of gain peaks.

In this manner, in the present embodiment, a wavelength variable mechanism can be implemented by combination of the semiconductor laser 560 and the reflecting portion 574. In the present embodiment, a wavelength variable light source capable of performing oscillation, for example, over an entire C band can be implemented.

Note that the technical features described in the above embodiments may be combined as appropriate.

REFERENCE SIGNS LIST

10 semiconductor substrate, 10*a* gain region, 10*b* phase shift region, 12 first clad layer, 14 current block layer, 16 second clad layer, 18 active layer, 20 diffraction grating, 22 active layer, 24, 26 light confinement layer, 28 diffraction grating, 30 cathode electrode, 32 anode electrode, 51 rear end surface, 52 front end surface, 60 semiconductor laser, 61 waveguide, 62 optical multiplexer/demultiplexer circuit, 63 waveguide, 64 optical amplifier, 70 second waveguide portion, 71 waveguide, 72 optical amplifier, 73 waveguide, 74 reflecting portion, 80 output light, 81 optical axis, 82 output light, 100, 200 optical semiconductor device, 262 optical multiplexer/demultiplexer circuit, 265 optical amplifier, 267 waveguide, 275 waveguide, 300 optical semiconductor device, 370 second waveguide portion, 375 waveguide, 376 light absorption portion, 400 optical semiconductor device, 434 diffraction grating, 462 optical multiplexer/demultiplexer circuit, 470 second waveguide portion, 474 reflecting portion, 500 optical semiconductor device, 512 first clad layer, 532 anode electrode, 536 diffraction grating, 538 insulating film, 540 heater, 542 diffraction grating, 560 semiconductor laser, 570 second waveguide portion, 574 reflecting portion

The invention claimed is:

1. An optical semiconductor device comprising:
a semiconductor substrate;
at least one semiconductor laser provided on the semiconductor substrate;

12 an optical multiplexer/demultiplexer circuit provided on the semiconductor substrate, the optical multiplexer/demultiplexer circuit being configured to multiplex or demultiplex first output light of the semiconductor laser and being configured to output second output light and third output light;
a first waveguide portion provided on the semiconductor substrate, the first waveguide portion being configured to output the second output light from an end face of the semiconductor substrate; and
a second waveguide portion including: an optical amplifier configured to amplify the third output light, and a reflecting portion, the second waveguide portion being provided on the semiconductor substrate,
wherein the reflecting portion includes a diffraction grating that is configured to reflect the third output light amplified by the optical amplifier to feed back to the semiconductor laser via the optical amplifier and the optical multiplexer/demultiplexer circuit, and
the semiconductor laser and the reflecting portion are configured to form a resonator.

2. The optical semiconductor device according to claim 1, wherein the second waveguide portion has a linear shape.

3. The optical semiconductor device according to claim 1, wherein a phase of an oscillation mode of the semiconductor laser is configured to match a phase of an oscillation mode of the resonator.

4. The optical semiconductor device according to claim 1, wherein the optical amplifier is configured to amplify the third output light so that a line width of the second output light becomes smaller compared to a case where the third output light is not amplified.

5. The optical semiconductor device according to claim 1, wherein the optical semiconductor device comprises a plurality of the semiconductor lasers,
the reflecting portion is an SG-DBR configured to have a plurality of reflection peaks, and
oscillation wavelengths of the plurality of semiconductor lasers are configured to match the plurality of reflection peaks of the SG-DBR.

6. The optical semiconductor device according to claim 1, wherein the optical semiconductor device comprises one semiconductor laser,
the reflecting portion is a DBR configured to have one reflection peak, and
an oscillation wavelength of the semiconductor laser is configured to match the reflection peak of the DBR.

7. The optical semiconductor device according to claim 1, wherein the optical semiconductor device comprises one semiconductor laser, and
the semiconductor laser is an SG-DFB configured to have a plurality of gain peaks,
the reflecting portion is a CSG-DBR configured to have a plurality of reflection peaks, and
the semiconductor laser is configured to output light of a wavelength that matches the plurality of reflection peaks among the plurality of gain peaks.

8. The optical semiconductor device according to claim 7, wherein the CSG-DBR includes a heater, and the plurality of reflection peaks can be adjusted by the heater.

9. The optical semiconductor device according to claim 1, wherein the second waveguide portion includes a light absorption portion that is provided on an opposite side of the optical amplifier with respect to the reflecting portion and configured to absorb light that has passed through the reflecting portion.

10. The optical semiconductor device according to claim 1, wherein the reflecting portion comprises:

a first clad layer provided on an upper surface of the semiconductor substrate;

a light confinement layer provided on an upper surface of the first clad layer;

a current block layer provided on both sides of the light confinement layer on the upper surface of the first clad layer; and a second clad layer provided on an upper surface of the light confinement layer and an upper surface of the current block layer.

11. The optical semiconductor device according to claim 9, wherein the light absorption portion comprises:

a first clad layer provided on an upper surface of the semiconductor substrate;

an active layer provided on an upper surface of the first clad layer;

a current block layer provided on both sides of the active layer on the upper surface of the first clad layer; and a second clad layer provided on an upper surface of the active layer and an upper surface of the current block layer.

12. The optical semiconductor device according to claim 1, wherein the second waveguide portion is substantially straight in plan view.

13. The optical semiconductor device according to claim 1, wherein the diffraction grating has a refractive index different from a refractive index of a clad layer in which the diffraction grating is provided.

14. The optical semiconductor device according to claim 1, wherein the reflecting portion is spaced from each end face of the semiconductor substrate in plan view.

\* \* \* \* \*